(12) United States Patent
Tsai

(10) Patent No.: US 8,566,755 B2
(45) Date of Patent: Oct. 22, 2013

(54) METHOD OF CORRECTING PHOTOMASK PATTERNS

(75) Inventor: Shih-Lung Tsai, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 976 days.

(21) Appl. No.: 11/945,073

(22) Filed: Nov. 26, 2007

(65) Prior Publication Data

US 2009/0138236 A1 May 28, 2009

(51) Int. Cl.
*G06F 17/50* (2006.01)
*G06F 17/10* (2006.01)

(52) U.S. Cl.
USPC .................................... 716/53; 703/2

(58) Field of Classification Search
USPC ........................ 703/19; 716/19–20
See application file for complete search history.

(56) References Cited

U.S. PATENT DOCUMENTS

| | | | |
|---|---|---|---|
| 5,933,359 A * | 8/1999 | Sawahata | 716/2 |
| 6,643,616 B1 * | 11/2003 | Granik et al. | 703/13 |
| 7,073,162 B2 * | 7/2006 | Cobb et al. | 716/20 |
| 7,079,223 B2 | 7/2006 | Rosenbluth et al. | |
| 7,131,104 B2 | 10/2006 | Gallatin et al. | |
| 7,207,030 B2 | 4/2007 | Kuchler et al. | |
| 2005/0132310 A1 | 6/2005 | Gallatin et al. | |

FOREIGN PATENT DOCUMENTS

| | | |
|---|---|---|
| TW | I 236698 | 7/2005 |
| TW | 1238923 | 9/2005 |
| TW | I 277828 | 4/2007 |

OTHER PUBLICATIONS

Glynn, Earl F. "Mixtures of Gaussians", Feb. 9, 2007, 8 pages, accessable at http://research.stowres-institute.org/efg/R/Statistics/MixturesOfDistributions/index.html.*
Randall et al. "Lithography Simulation with Aerial Image—Variable Threshold Resist Model", 1999, Microelectronic Engineering 46, pp. 59-63.*

* cited by examiner

*Primary Examiner* — Suzanne Lo
(74) *Attorney, Agent, or Firm* — J.C. Patents

(57) ABSTRACT

A method of predicting photoresist patterns defined by a plurality of photomask patterns is described. The measurement data of photoresist patterns defined by patterns on a photomask that are arranged similar to the photomask patterns are provided. A physical optical kernel and a mathematical load kernel as a part of a Gaussian distribution function or other distribution function or as a combined function including a part of a Gaussian distribution function or other distribution function are provided. The optimal values of the parameters of the mathematical load kernel are determined by fitting the experiment data with a simulation based on the graphic data of the patterns on the photomask and the kernels. Photoresist patterns defined by the photomask patterns are simulated based on the graphic data of the photomask patterns, the physical optical kernel, and the mathematical load kernel with the optimal values of the parameters determined.

12 Claims, 4 Drawing Sheets

METHOD OF CORRECTING PHOTOMASK PATTERNS

BACKGROUND OF THE INVENTION

1. Field of the Invention

This invention relates to the lithography technology. More particularly, this invention relates to a method of predicting photoresist patterns defined by a plurality of photomask patterns, a method of analyzing the measurement data of real photoresist patterns defined by a plurality of patterns on an existing photomask, and a simulation of photoresist patterns defined by a plurality of photomask patterns.

2. Description of the Related Art

As the linewidth of IC process is much reduced, optical proximity correction (OPC) is usually required in the design of a photomask. To check the effects of OPC, photomask patterns with OPC have to be verified based on the prediction of photoresist patterns defined thereby, which is conventionally based on a simulation of the exposure intensity distribution at the photoresist layer. By setting a threshold intensity, predicted photoresist patterns are obtained from the distribution. According to the photoresist patterns predicted, further OPC is done to further modify the photomask patterns so that the later predicted photoresist patterns are closer to those required by the IC process.

When only the setting of the exposure optical system is considered, the exposure intensity at a position of the photoresist layer can be calculated by numerical integration of the following Hopkins integral as disclosed in U.S. Pat. No. 7,079,223:

$$I_0(\vec{r}) = \iiiint d\vec{r}' d\vec{r}'' h(\vec{r} - \vec{r}') h^*(\vec{r} - \vec{r}'') j(\vec{r}' - \vec{r}'') m(\vec{r}') m^*(\vec{r}'') \quad (1),$$

wherein h is the lens impulse response function also known as the point spread function (PSF), j is the coherence function, m is the mask transmission function, "*" indicates the complex conjugate and "r" is the position of the image. $I_0(\vec{r})$ is the intensity of the aerial image at the position "$\vec{r}$", and is also the basis of the physical optical kernel.

However, when aspects of the other photoresist exposure and chemical kinetics, such as the diffusion of the photoacid in the photoresist layer, are taken into account, a mathematical load kernel is usually used in the simulation to represent the effect of the photoresist chemical kinetics, because the photoresist chemical kinetics is very complex and is difficult to simulate by mathematical formulae satisfying chemical principles.

A traditional mathematical load kernel is a full Gaussian distribution function which is expressed as formula (2):

$$\frac{1}{\sqrt{2\pi}\,\sigma} \cdot e^{-r^2/2\sigma^2}, \quad (2)$$

wherein $\sigma$ is the standard deviation of the Gaussian function, as the only one parameter capable of modifying the shape of the kernel. However, since the proximity behaviors of patterns with different line widths and pitches are usually relatively different, it is difficult to fit all photoresist patterns of different pitches and linewidths with only one parameter. For example, photoresist patterns with a small critical dimension cannot be fitted well enough with a load kernel as a full Gaussian distribution function with only one parameter ($\sigma$).

SUMMARY OF THE INVENTION

Accordingly, this invention provides a method of analyzing measurement data of photoresist patterns defined by a plurality of patterns on a photomask, which is based on a simulation that utilizes a mathematical load kernel as a part of a Gaussian distribution function or other distribution function or as a combined function including a part of a Gaussian distribution function or other distribution function.

This invention also provides a method of predicting photoresist patterns defined by a plurality of photomask patterns, which is based on the above analyzing method.

The photoresist pattern simulation of this invention is based on the graphic data of the corresponding patterns on the photomask, a physical optical kernel and a mathematical load kernel defined as above.

The method of analyzing measurement data of photoresist patterns defined by a plurality of patterns on a photomask of this invention is described below. The graphic data of the patterns on the photomask are provided, and a physical optical kernel and a mathematical load kernel defined as above are provided. The optimal values of the parameters of the mathematical load kernel are determined by fitting the measurement data with a simulation of the photoresist patterns that is based on the graphic data of the patterns on the photomask, the physical optical kernel and the mathematical load kernel.

The method of predicting photoresist patterns defined by photomask patterns of this invention is based on the method of analyzing the measurement data of photoresist patterns of this invention, wherein the photomask patterns are arranged similar to the patterns on the real photomask for defining the photoresist patterns. After the optimal values of the parameters of the load kernel are determined with similar patterns on a real photomask and the photoresist patterns defined thereby, photoresist patterns defined by the photomask patterns are simulated based on the graphic data of the photomask patterns, the physical optical kernel, and the mathematical load kernel with the optimal values of the parameters determined.

By setting the mathematical load kernel as a part of a Gaussian distribution function or other distribution function or as a combined function including a part of a Gaussian distribution function or other distribution function, the measurement data of photoresist patterns can be fitted better with the simulation based on the corresponding patterns. Moreover, with a combined function kernel, the proximity behavior of the model can be modified for different linewidths and pitches independently. This means that respective photoresist patterns defined by different groups of photoresist patterns having different linewidth-pitch combinations each can be predicted more accurately.

It is to be understood that both the foregoing general description and the following detailed description are exemplary, and are intended to provide further explanation of the invention as claimed.

DESCRIPTION OF THE PREFERRED EMBODIMENTS

Figure 1:
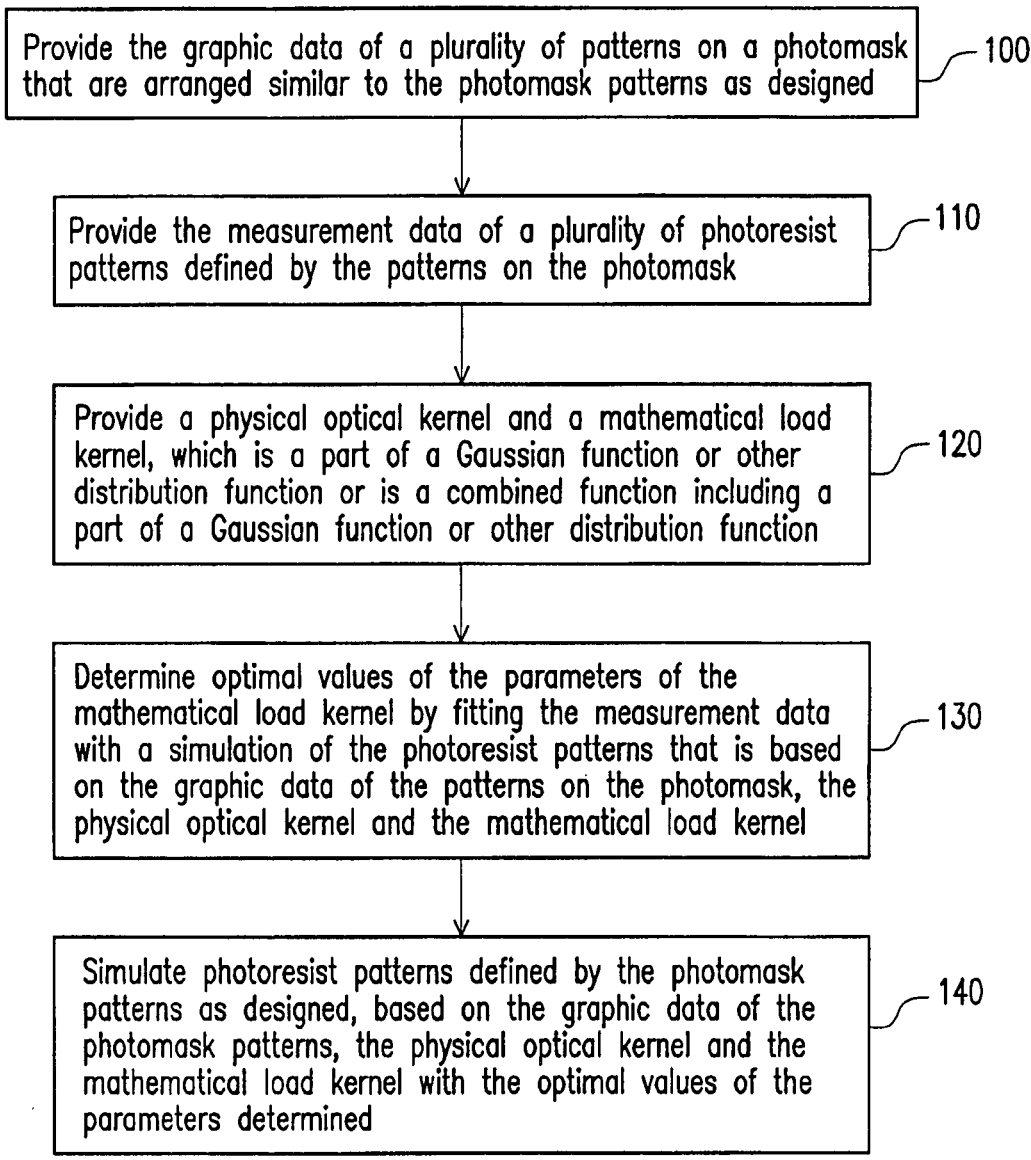
FIG. 1 is a flow chart of a method of predicting photoresist patterns defined by a plurality of photomask patterns according to an embodiment of this invention.

FIG. 1 is a flow chart of a method of predicting photoresist patterns defined by a plurality of photomask patterns according to an embodiment of this invention. The photomask patterns may have been subjected to at least one time of optical proximity correction, or may be the patterns just designed according to the circuit design rule.

In the step 100, the graphic data of a plurality of patterns on a photomask that are arranged similar to the photomask patterns as designed are provided. When the photomask patterns as designed are dense or isolated patterns, for example, the patterns on the photomask are similar dense or isolated patterns.

In next step 110, the measurement data of a plurality of photoresist patterns defined by the patterns on the photomask are provided. The measurement data mainly include the data of the lengths/widths of different parts of the photoresist patterns as measured with electron microscopy.

Figure 2A:
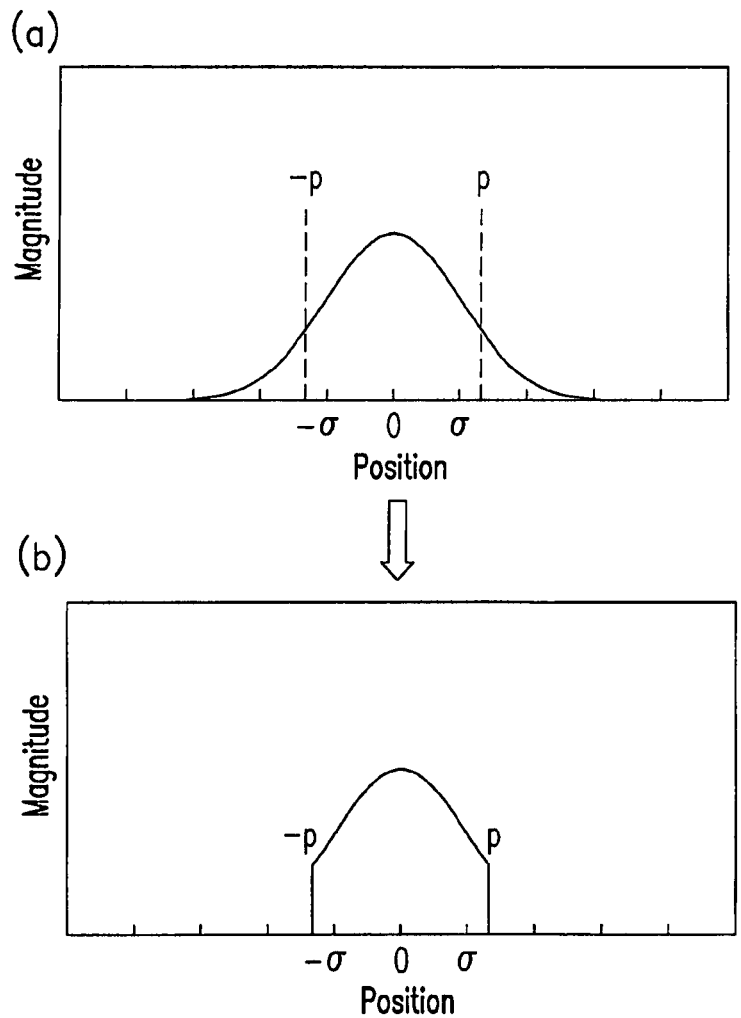
FIG. 2A(a)/(b) illustrate the generation of a symmetric central part of a Gaussian distribution function as a mathematical load kernel according to an embodiment of this invention.
Figure 2B:
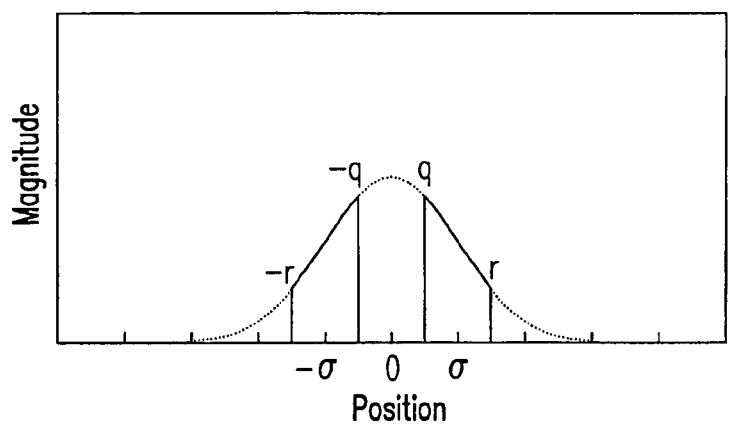
FIG. 2B illustrates a symmetric side part of a Gaussian distribution function as another mathematical load kernel according to the embodiment of this invention.
Figure 3:
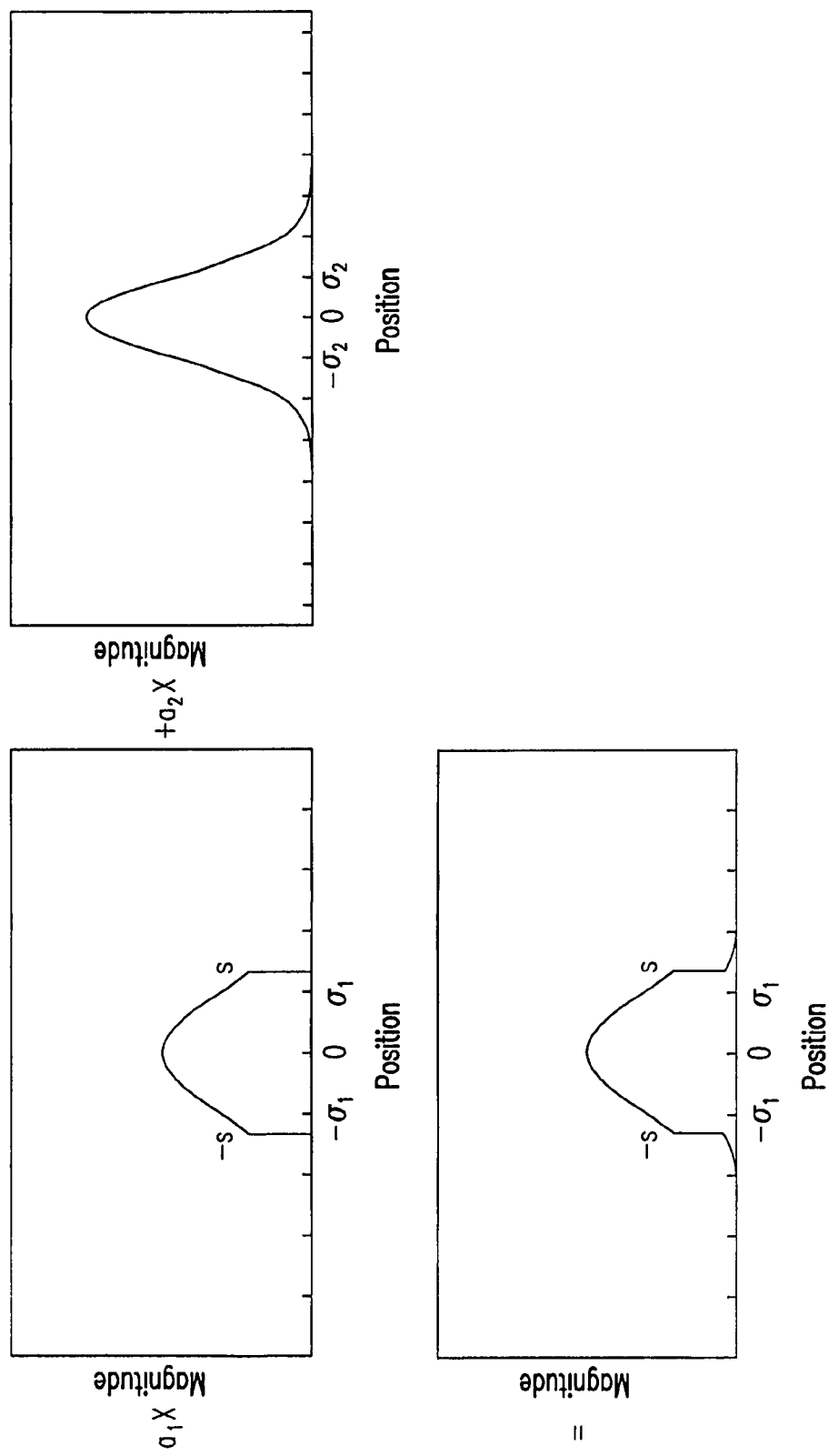
FIG. 3 shows the generation of a combined function that including a part of a Gaussian distribution function and a full Gaussian distribution function and serves as still another mathematical load kernel according to the embodiment of this invention.

In next step 120, a physical optical kernel and a mathematical load kernel are provided. The mathematical load kernel is a part of a Gaussian distribution function or other distribution function, or is a combined function including a part of a Gaussian distribution function or other distribution function. Two exemplary mathematical load kernels each as a part of a Gaussian distribution function are illustrated in FIGS. 2A and 2B. Another exemplary mathematical load kernel as a combined function including a part of a Gaussian distribution function is illustrated in FIG. 3. It is particularly noted that each of the load kernels is a function of x and y coordinates but is plotted as a cross section thereof in the xz- or yz-plane in the corresponding figure for convenience.

Referring to FIG. 2A(a)/(b), the mathematical load kernel in this example is a symmetric central part of a Gaussian distribution function having two parameters, i.e., the standard deviation ($\sigma$) and the cutting position (p) of the curved surface, to be determined by fitting.

Referring to FIG. 2B, the mathematical load kernel in this example is a symmetric side part of a Gaussian distribution function having three parameters, i.e., the standard deviation ($\sigma$), the inner cutting position (q) and the outer cutting position (r) of the curved surface, to be determined by simulation fitting. The selection of which part of a Gaussian curve depends on the practical requirements.

Referring to FIG. 3, the mathematical load kernel in this example is a combined function including a symmetric central part of a Gaussian distribution function with a standard deviation $\sigma_1$ and a full Gaussian distribution function with a standard deviation $\sigma_2$. The load kernel has totally five parameters to be determined for optimal values, which include the coefficients $a_1$ and $a_2$ of the partial Gaussian function and the full Gaussian function, $\sigma_1$, $\sigma_2$ and the cutting position (s) of the curved surface with the standard deviation $\sigma_1$.

In another example (not shown), the mathematical load kernel is a combined function including a symmetric side part of a Gaussian distribution function as shown in FIG. 2B and a full Gaussian distribution function.

It is also feasible to combine three or more Gaussian functions among which at least one is a symmetric partial Gaussian distribution function, if required. For example, the mathematical load kernel may be a combined function including a symmetric side part of a Gaussian distribution function as shown in FIG. 2B, a full Gaussian distribution function and a symmetric central part of a Gaussian distribution function as shown in FIG. 2A(b). Moreover, in some embodiments, other type of distribution function can be used instead of the Gaussian distribution function. With a combined function kernel, the proximity behavior of the model can be modified for different linewidths and pitches independently.

In next step 130, the optimal values of the parameters of the mathematical load kernel are determined by fitting the measurement data with a simulation of the resist patterns based on the graphic data of the patterns on the photomask, the physical optical kernel and the mathematical load kernel. Briefly speaking, a set of initial values of the parameters of the mathematical load kernel is given, and the effective exposure intensity at each position of the photoresist layer is calculated by the numerical integration of the physical optical kernel and the mathematical load kernel. The value of each parameter is then adjusted according to the differences between the measurement data and the data derived from the simulation. By repeating the above steps one or more times to minimize the differences, the optimal combination of the values of the parameters can be determined. Such a fitting process can be done by many application software packages applications like Synopsys Progen, Mentor Graphics Calibre RET.

Figure 4:
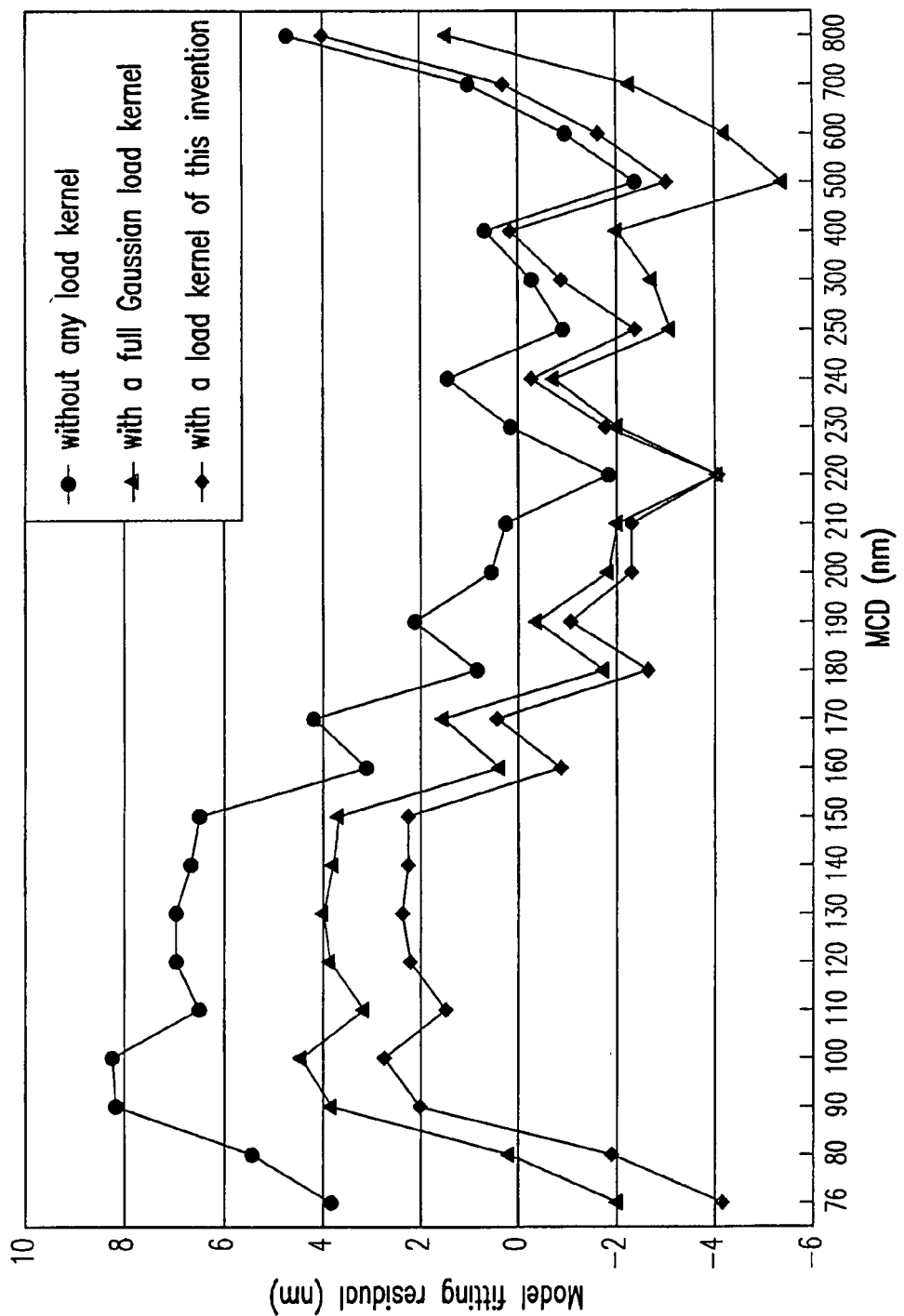
FIG. 4 shows the variation of the model fitting residual with the mask critical dimension (MCD) in an example of this invention that used a symmetric central part of a Gaussian distribution function as a mathematical load kernel to fit linear patterns.

FIG. 4 shows the variation of the model fitting residual with the mask critical dimension (MCD) in an example of this invention that used a symmetric central part of a Gaussian distribution function as a mathematical load kernel to fit linear patterns. The model fitting residual was calculated as the difference between the linewidth of the simulated pattern of the optimal fitting (simulated DCD) and that of the real photoresist pattern (wafer DCD). It is quite clear from FIG. 4 that the different models with the different load kernels yielded different residual variations.

Referring to FIG. 4, when no load kernel was used, the modeled DCD was close to wafer DCD in the MCD range larger than 200 nm, but the fitting residuals were larger for smaller patterns. With the intention to decrease the fitting residuals for smaller patterns by introducing a load kernel as a full Gaussian distribution function, the errors of simulated DCDs of larger patterns adversely increased. On the other hand, the use of a multi-variable load kernel of this invention made satisfactory small residuals for both small and large patterns simultaneously. Accordingly, in an OPC procedure, more accurate modeling with smaller fitting residuals is anticipated with a multi-variable load kernel of this invention.

Referring to FIG. 1 again, in next step 140, photoresist patterns defined by the photomask patterns as designed are simulated based on the graphic data of the photomask patterns, the physical optical kernel, and the mathematical load kernel with the optimal values of the parameters determined. The formula for calculating the effective exposure intensity at each position of the photoresist layer and the formulae of the physical optical kernel and the mathematical load kernel are the same as above.

After photoresist patterns defined by a set of photomask patterns having a linewidth/pitch combination are simulated, photoresist patterns defined by another set of photomask patterns having another linewidth/pitch combination can be simulated with the same method mentioned above. According to the photoresist patterns as predicted, further OPC can be performed to further modify the photomask patterns so that the later predicted photoresist patterns are closer to those required by the IC process.

By setting the mathematical load kernel as a part of a Gaussian distribution function or other distribution function or as a combined function including a part of a Gaussian distribution function or other distribution function, the measurement data of photoresist patterns can be fitted better with the simulation based on the corresponding patterns. Moreover, with a combined function kernel, the proximity behavior of the model can be modified for different linewidths and pitches independently. This means that respective photoresist patterns defined by different groups of photoresist patterns having different linewidth-pitch combinations each can be predicted more accurately. Consequently, more satisfactory OPC patterns can be designed to improve the quality of pattern transfer in an IC fabricating process.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of correcting photomask patterns, comprising:
    providing measurement data of a plurality of photoresist patterns defined by patterns on a photomask that are arranged similar to the photomask patterns;
    providing a physical optical kernel and a mathematical load kernel, wherein the mathematical load kernel is a part of a first Gaussian distribution function or is a combined function including a part of a first Gaussian distribution function and an entire curve of a second Gaussian distribution function different from the first Gaussian distribution function;
    determining optimal values of parameters of the mathematical load kernel by fitting the measurement data with a simulation of the photoresist patterns, wherein the simulation uses graphic data of the patterns on the photomask, the physical optical kernel, and the mathematical load kernel;
    simulating photoresist patterns defined by the photomask patterns using graphic data of the photomask patterns, the physical optical kernel, and the mathematical load kernel with the optimal values of the parameters determined; and
    performing optical proximity correction (OPC) to modify the photomask patterns according to the simulated photoresist patterns.

2. The method of claim 1, wherein the mathematical load kernel is a symmetric central part of the first Gaussian distribution function, and the symmetric central part of the first Gaussian distribution function is symmetric with respect to a central axis of an entire curve of the first Gaussian distribution function.

3. The method of claim 1, wherein the mathematical load kernel is a symmetric side part of the first Gaussian distribution function, and the symmetric side part of the first Gaussian distribution function is symmetric with respect to a central axis of an entire curve of the first Gaussian distribution function.

4. The method of claim 1, wherein the mathematical load kernel is a combined function including a symmetric central part of the first Gaussian distribution function, and the entire curve of the second Gaussian distribution function, and the symmetric central part of the first Gaussian distribution function is symmetric with respect to a central axis of an entire curve of the first Gaussian distribution function.

5. The method of claim 1, wherein the mathematical load kernel is a combined function including a symmetric side part of the first Gaussian distribution function, and the entire curve of the second Gaussian distribution function, and the symmetric side part of the first Gaussian distribution function is symmetric with respect to a central axis of an entire curve of the first Gaussian distribution function.

6. The method of claim 1, wherein the mathematical load kernel is a combined function including a symmetric side part of the first Gaussian distribution function, the entire curve of the second Gaussian distribution function, and a symmetric central part of a third Gaussian distribution function, the symmetric side part of the first Gaussian distribution function is symmetric with respect to a central axis of an entire curve of the first Gaussian distribution function, and the symmetric central part of the third Gaussian distribution function is symmetric with respect to a central axis of an entire curve of the third Gaussian distribution function.

7. A method of correcting photomask patterns, comprising:
    simulating photoresist patterns defined by the photomask patterns using graphic data of the photomask patterns, a physical optical kernel, and a mathematical load kernel, wherein the mathematical load kernel is a part of a first Gaussian distribution function or is a combined function including a part of a first Gaussian distribution function and an entire curve of a second Gaussian distribution function different from the first Gaussian distribution function; and
    performing optical proximity correction (OPC) to modify the photomask patterns according to the simulated photoresist patterns.

8. The method of claim 7, wherein the mathematical load kernel is a symmetric central part of the first Gaussian distribution function, and the symmetric central part of the first Gaussian distribution function is symmetric with respect to an entire central axis of an entire curve of the first Gaussian distribution function.

9. The method of claim 7, wherein the mathematical load kernel is a symmetric side part of the first Gaussian distribution function, and the symmetric side part of the first Gaussian distribution function is symmetric with respect to a central axis of an entire curve of the first Gaussian distribution function.

10. The method of claim 7, wherein the mathematical load kernel is a combined function including a symmetric central part of the first Gaussian distribution function, and the entire curve of the second Gaussian distribution function, and the symmetric central part of the first Gaussian distribution function is symmetric with respect to a central axis of an entire curve of the first Gaussian distribution function.

11. The method of claim 7, wherein the mathematical load kernel is a combined function including a symmetric side part of the first Gaussian distribution function, and the entire curve of the second Gaussian distribution function, and the symmetric side part of the first Gaussian distribution function is symmetric with respect to a central axis of an entire curve of the first Gaussian distribution function.

12. The method of claim 7, wherein the mathematical load kernel is a combined function including a symmetric side part of the first Gaussian distribution function, the entire curve of the second Gaussian distribution function, and a symmetric central part of a third Gaussian distribution function, the symmetric side part of the first Gaussian distribution function is symmetric with respect to a central axis of an entire curve of the first Gaussian distribution function, and the symmetric central part of the third Gaussian distribution function is symmetric with respect to a central axis of an entire curve of the third Gaussian distribution function.

* * * * *